United States Patent
Sprattle et al.

(10) Patent No.: US 6,552,903 B2
(45) Date of Patent: Apr. 22, 2003

(54) ELECTRONIC MODULE

(75) Inventors: Joachim Sprattle, Osnabrück (DE); Jörg Reinhardt, Lahnau (DE); Thomas Pfifferling, Wetzlar (DE)

(73) Assignee: Mannesmann VDO AG, Frankfurt am Main (DE)

(*) Notice: Subject to any disclaimer, the term of this patent is extended or adjusted under 35 U.S.C. 154(b) by 0 days.

(21) Appl. No.: 09/846,858

(22) Filed: May 1, 2001

(65) Prior Publication Data

US 2002/0003692 A1 Jan. 10, 2002

(30) Foreign Application Priority Data

May 27, 2000 (EP) ............................................ 100 26 351

(51) Int. Cl.⁷ ................................................. H05K 7/20
(52) U.S. Cl. ........................ 361/704; 361/707; 361/709; 361/710; 361/719; 174/16.3; 165/80.3; 165/185
(58) Field of Search ................................. 361/704, 709, 361/710, 707, 714–720, 800, 816, 818; 257/706, 718, 719, 727; 174/16.1, 16.3, 35 R; 165/80.2, 80.3, 185

(56) References Cited

U.S. PATENT DOCUMENTS

| 5,526,232 A | * | 6/1996 | Kolberg et al. ............. 361/715 |
| 5,717,577 A | * | 2/1998 | Mendolia et al. ........... 361/818 |
| 6,025,991 A | * | 2/2000 | Saito .......................... 361/704 |
| 6,043,874 A | * | 3/2000 | Watanabe ................... 361/704 |
| 6,075,703 A | * | 6/2000 | Lee ............................ 361/707 |
| 6,081,424 A | * | 6/2000 | Mach et al. ................ 361/704 |

FOREIGN PATENT DOCUMENTS

| DE | 4212369 C2 | 10/1993 | ............ H05K/9/00 |
| DE | 4226816 A1 | 2/1994 | ........... H01L/23/40 |

* cited by examiner

*Primary Examiner*—Boris Chervinsky
(74) *Attorney, Agent, or Firm*—Richard A. Speer; Mayer, Brown, Rowe & Maw

(57) ABSTRACT

In an electronic module having an electronic component which is arranged within an electromagnetic shielding, a thermally conductive element which is connected in a thermally conductive fashion to a shield frame of the shield rests simultaneously on the component. As a result, the heat from the component penetrates the shield, with the result that the latter is capable of carrying out the function of a thermal exchange surface.

3 Claims, 2 Drawing Sheets

ELECTRONIC MODULE

BACKGROUND OF THE INVENTION

The invention relates to an electronic module having an electronic component which is arranged within an electromagnetic shielding.

Electronic modules of the abovementioned type are available in a wide variety of electronic devices, for example in vehicle navigation apparatuses or mobile phones. In order to provide sufficient electromagnetic compatibility, such components often have to be shielded in a largely airtight fashion by the electromagnetic shielding, which often leads to problems owing to the necessary conduction away of heat, in particular if the shielding encloses the component relatively closely.

Usually, cooling baffles which pick up heat from the component and emit it into the surroundings via a thermal exchange surface which is as large as possible are used to conduct away heat in electronic components. However in components with a large power loss this leads to an undesirably large power loss on the necessary space.

The invention is based on the object of embodying an electronic module of the type mentioned at the beginning with an electromagnetic shielding in such a way that it can be embodied in as compact a way as possible without problems arising with the conduction away of the heat generated by the component.

This problem is solved according to the invention by virtue of the fact that the electronic component is connected in a thermally conductive fashion to the shielding by means of a thermally conductive element which rests on it.

BRIEF SUMMARY OF THE INVENTION

This configuration according to the invention uses the shielding as a thermal exchange surface for the emission of the heat generated by the electronic component to the air surrounding the shielding on the outside. For this reason, the invention makes it possible to dispense with large-volume cooling baffles. Instead, it is sufficient to use a thermally conductive element which conducts the heat generated in the component into the shielding to a sufficient degree.

If the shielding is formed from the shield frame which extends on each side of a printed circuit board and two shield covers which each close off the shield frame on one side, a particularly simple design of the module is obtained when the thermally conductive element is connected in a thermally conductive fashion to the shield frame.

A particularly effective embodiment is obtained if the thermally conductive element is a bent piece of sheet metal which is attached by one limb to the shield frame and rests with its other limb on the component. Such a thermally conductive element can consist, without regard to the material of the shield frame, of a material which is a good conductor of heat, and have such a thickness that the heat can be conducted away sufficiently quickly and its capacity is sufficient to be able to take up short-term thermal peaks.

The thermally conductive element is mounted particularly easily if, according to another development of the invention, the shield frame has an opening in the vicinity of the thermally conductive element, and the thermally conductive element engages behind the opening with a downwardly directed projection of its limb which bears against the shield frame. This embodiment permits premounting of the thermally conductive elements by virtue of the fact that they are simply inserted into the respective opening and only later fixedly connected to the shield frame by means of screws.

The module can be manufactured particularly cost-effectively if the thermally conductive element is a sheet-metal region of the shield frame which is bent out of the plane of the shield frame and rests on the component from above.

Because the thermally conductive element must be composed of a thermally conductive material, usually aluminum or copper, it cannot press onto the electronic component with sufficient prestressing force owing to its elasticity. A high contact force which is sufficient for a good thermal junction is obtained if the thermally conductive element is held on the component by means of a contact spring which is of bridge-like design and which is supported with one region of its base on the thermally conductive element and has, on each side of the component, a spring leg which is anchored to the printed circuit board.

The contact spring is configured particularly simply if, according to another development of the invention, the two spring legs each lead through an opening in the printed circuit board and are locked to the printed circuit board on the side of the printed circuit board facing away from the component by means of, in each case, one locking projection on the spring leg.

BRIEF DESCRIPTION OF THE DRAWINGS

The invention permits various embodiments. Two of them are illustrated schematically in the drawing and described below. In said drawing.

DETAILED DESCRIPTION OF THE INVENTION

Figure 1:
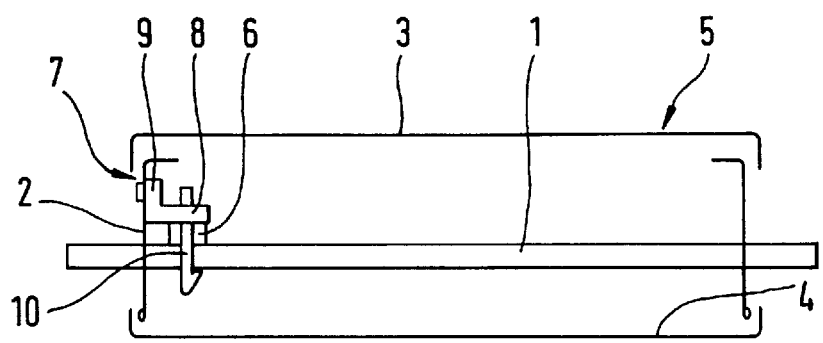
FIG. 1 shows a section through a module according to the invention.

FIG. 1 shows a printed circuit board 1 to which a shield frame 2 is attached. This shield frame 2 forms, together with two shield covers 3, 4, an electromagnetic shielding 5. Within this electromagnetic shielding 5 there is an electronic component 6, which has a high power loss and therefore generates heat, on the printed circuit board 1. According to the invention, this heat is directed into the shield frame 2 via a thermally conductive element 7 which is embodied as a bent piece of sheet metal. For this purpose, the thermally conductive element 7 bears with one limb 8 on the component 6 from above and with its other limb 9 against the shield frame 2. As a result, the heat of the component 6 is directed into the shield frame 2, which is therefore able to act as a thermal exchange surface. A good thermal junction between the component 6 and the thermally conductive element 7 is obtained by virtue of the fact that a contact spring 10 presses the limb 8 onto the component 6.

Figure 2:
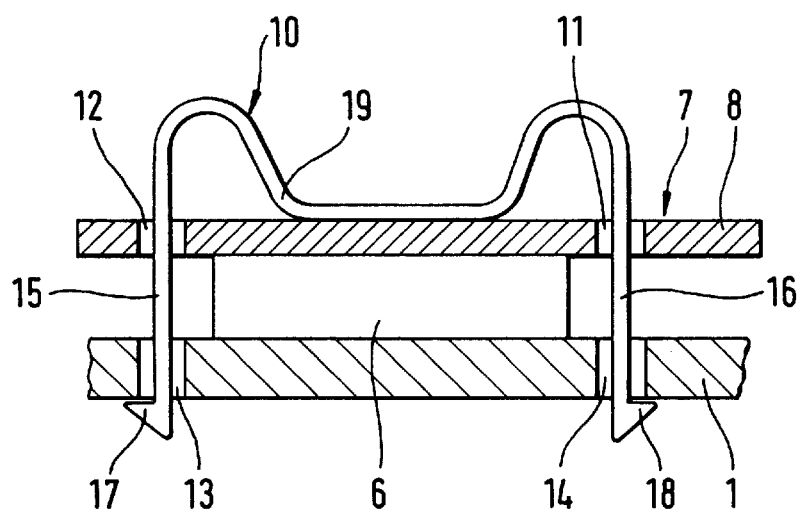
FIG. 2 shows a section which is enlarged in scale and rotated through 90° with respect to FIG. 1, through a region of the module.

The enlarged-scale sectional view according to FIG. 2 shows, in turn, the component 6 which is seated on the printed circuit board 1. The limb 8 of the thermally conductive element 7 which rests on the component 6 has two through-going holes 11, 12 which are at least approximately flush with corresponding openings 13, 14 in the printed circuit board 1. It is apparent that the contact spring 10 has two spring legs 15, 16 which lead through the holes 11, 12 and the openings 13, 14 and are locked to the printed circuit board 1 on the side of said printed circuit board which faces away from the component 6, by means of locking projections 17, 18. The two spring legs 15, 16 are connected to one another above the component 6 by means of a base 19 which bears with prestress against the limb 8 of the thermally conductive element 7 in the central region.

Figure 3:
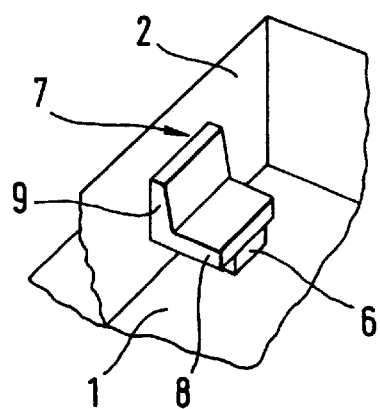
FIG. 3 shows a perspective view of a corner region of the module.

The perspective view according to FIG. 3 additionally clarifies how the thermally conductive element 7 which is embodied as a bent piece of sheet metal rests with its limb 9 against the shield frame 2 and with its limb 8 on the component 6.

Figure 4:
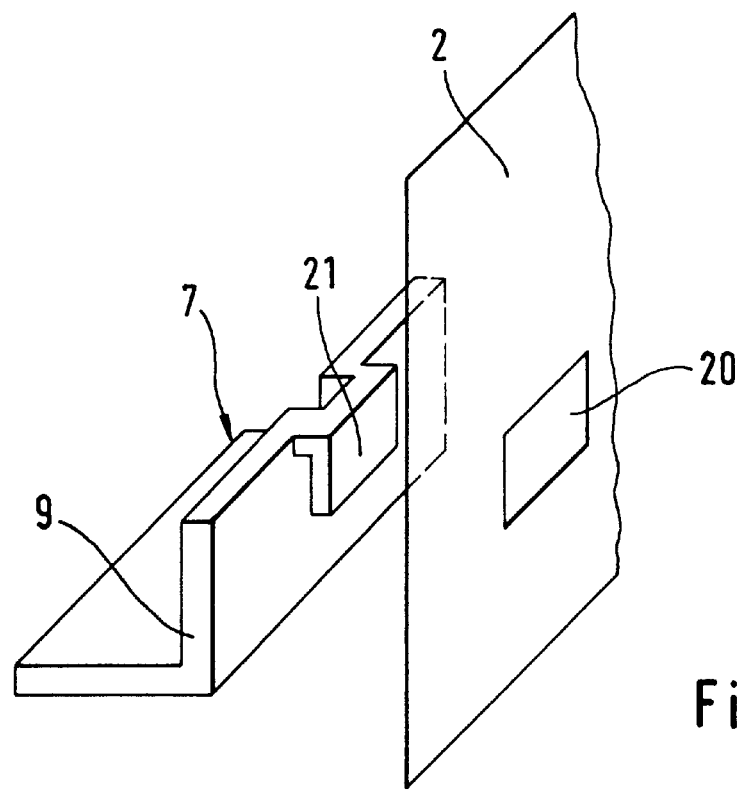
FIG. 4 shows a view from the outside onto a region of a shield frame and a thermally conductive element (not yet mounted)

FIG. 4 shows that the shield frame 2 has a window-like opening 20. A projection 21, which is provided projecting downward in the rear region of the limb 9 of the thermally conductive element 7 can be inserted into this opening 20. By means of this projection 21, it is possible to secure the thermally conductive element 7, initially loosely, to the shield frame 2, before finally attaching it at the end of the mounting operation, for example by means of screws.

Figure 5:
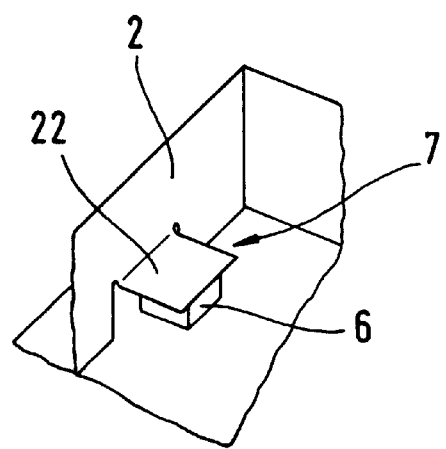
FIG. 5 shows a perspective view of a second embodiment of a corner region of the module.

In the embodiment according to FIG. 5, the shield frame 2 forms at the same time the thermally conductive element 7. For this purpose, a sheet-metal region or tab 22 has been bent at right angles out of the plane of the shield frame 2 by means of corresponding indents into the shield frame 2, with the result that it can rest completely on the component 6 from above and is therefore capable of conducting heat from the component 6 into the shield frame 2.

What is claimed is:

1. An electronic module having a heat producing electronic component, the module comprising:
   (a) electromagnetic shielding including,
      (i) a shield frame which extends on both sides of a printed circuit board; (ii) two shield covers which each close off the shield frame on one side; an opening in the shield frame in the vicinity of the electronic component; and
      (ii) a thermally conductive element formed of a piece of L-shaped metal which is attached by one limb to the shield frame behind the opening and rests with its other limb on the electronic component.

2. The module as defined in claim 1 wherein the thermally conductive element is held on the electronic component by means of a U-shaped contact spring that spans the electronic component and has downwardly extending spring legs which are anchored to the printed circuit board on each side of the electronic component.

3. The module as claimed in claim 2, wherein the two spring legs each lead through an opening in the printed circuit board and are locked to the printed circuit board on the side of the printed circuit board facing away from the electronic component by means of, in each case, one locking projection on the spring leg.

* * * * *